(12) United States Patent
Bedard

(10) Patent No.: US 6,737,374 B2
(45) Date of Patent: May 18, 2004

(54) USE OF ZEOLITES IN PREPARING LOW TEMPERATURE CERAMICS

(75) Inventor: Robert L. Bedard, McHenry, IL (US)

(73) Assignee: UOP LLC, Des Plaines, IL (US)

( * ) Notice: Subject to any disclaimer, the term of this patent is extended or adjusted under 35 U.S.C. 154(b) by 60 days.

(21) Appl. No.: 10/223,225

(22) Filed: Aug. 16, 2002

(65) Prior Publication Data

US 2003/0224921 A1 Dec. 4, 2003

Related U.S. Application Data

(63) Continuation-in-part of application No. 10/141,229, filed on May 7, 2002, now abandoned.

(51) Int. Cl.[7] ............................................. C03C 14/00
(52) U.S. Cl. ............................................................. 501/32
(58) Field of Search ................ 501/32, 119; 423/328.1, 423/328.2, 700

(56) References Cited

U.S. PATENT DOCUMENTS

| | | | |
|---|---|---|---|
| 4,714,687 A | 12/1987 | Holleran et al. ................ 501/9 |
| 4,882,302 A | * 11/1989 | Horiuchi et al. .............. 501/27 |
| 4,945,074 A | * 7/1990 | Blount ........................ 501/53 |
| 4,980,323 A | 12/1990 | Bedard et al. .............. 501/119 |
| 5,036,030 A | 7/1991 | Taga et al. .................. 501/125 |
| 5,064,790 A | 11/1991 | Bedard et al. .............. 501/119 |
| 5,071,801 A | 12/1991 | Bedard et al. .............. 501/128 |
| 5,164,342 A | 11/1992 | Muralidhar et al. .......... 501/20 |
| 5,166,107 A | 11/1992 | Taga et al. ................. 501/119 |
| 5,277,844 A | 1/1994 | Rainey ....................... 252/518 |
| 5,568,652 A | * 10/1996 | Wu ............................ 264/434 |
| 5,663,109 A | * 9/1997 | Dietz et al. .................... 501/41 |
| 5,678,165 A | * 10/1997 | Wu .............................. 419/37 |
| 5,821,181 A | 10/1998 | Bethke et al. .................. 501/8 |
| 6,232,251 B1 | 5/2001 | Terashi et al. .................. 501/5 |

FOREIGN PATENT DOCUMENTS

EP     0 700 882 A1     7/1995

* cited by examiner

*Primary Examiner*—David Sample
*Assistant Examiner*—Elizabeth A. Bolden
(74) *Attorney, Agent, or Firm*—John G. Tolomei; Frank S. Molinaro

(57) ABSTRACT

A dielectric ceramic article precursor and a process for preparing a dielectric ceramic article are presented. The ceramic article precursor comprises a crystalline aluminosilicate zeolite or an amorphous aluminosilicate and a glass phase. The ceramic article precursor can optionally contain at least one forming aid selected from binders, plasticizers and surfactants. Metal oxide additives such as $B_2O_3$ or $SnO_2$ as well as metal oxide precursor additives such as nitrates or carbonates of metals such as boron or tin can also be included in the ceramic article precursor. The process for preparing a dielectric ceramic article involves forming a mixture from the above components into a shaped article such as a tape and then calcining the shaped article at a temperature of about 700° C. to about 1000° C. for a time of about 0.5 to about 24 hours.

31 Claims, No Drawings

USE OF ZEOLITES IN PREPARING LOW TEMPERATURE CERAMICS

CROSS-REFERENCE TO RELATED APPLICATION

This application is a continuation-in-part of application Ser. No. 10/141,229 filed May 7, 2002, now abandoned the contents of which are hereby incorporated by reference.

FIELD OF THE INVENTION

This invention relates to a dielectric ceramic article precursor and a process for preparing a dielectric ceramic article. The precursor article comprises a crystalline zeolite or an amorphous aluminosilicate in combination with a glass phase.

BACKGROUND OF THE INVENTION

The demand for smaller and multifunction electronic devices such as wireless phones with internet access, PDA, etc. has necessitated an ever increasing density of multilayer circuits. These multilayer circuits typically use dielectric materials which act as insulating substrates onto which are deposited conducting metals to form a wiring layer.

Very early on, alumina was the dielectric material of choice, which because of its high sintering temperature (1400°–1500° C.) necessitated the use of metals such as tungsten or molybdenum. However, as signal transmission speeds have increased to 1 GHz and above, the use of tungsten or molybdenum wire is not possible because of their high resistivity. This necessitates the use of lower resistivity metals such as gold, silver or copper. These metals, however, have much lower melting temperatures which in turn require dielectrics which sinter at temperature as low as 900° C.

The art has attempted to meet this need with low temperature cofired ceramics (LTCC). These ceramics are formed by mixing, glassy materials with crystalline phases. For example, U.S. Pat. No. 5,821,181 discloses forming a mixture of alumina, a glassy precursor material and a modifier. The glassy material contains $SiO_2$, $B_2O_3$, at least one of MgO, CaO, SrO and BaO and at least one of $K_2O$, $Na_2O$ and $Li_2O$; while the modifier is selected from $TiO_2$, $SrTiO_3$ and $CaTiO_3$. U.S. Pat. No. 4,714,687 discloses preparing a glass-ceramic containing willemite as the crystalline phase. The glass-ceramic body contains ZnO, MgO, $Al_2O_3$ and $SiO_2$. U.S. Pat. No. 5,164,342 discloses a low dielectric glass ceramic containing CaO, $B_2O_3$ and $SiO_2$. In U.S. Pat. No. 6,232,251 B1 a dielectric ceramic is disclosed which comprises a diopside oxide crystal phase; a crystal phase selected from a quartz crystal phase and a composite oxide crystal phase containing Ti and Mg or Zn and a glass phase.

It is also disclosed in the art that zeolitic compositions can be sintered directly into ceramics. Thus, U.S. Pat. No. 5,071,801 discloses preparing a high density leucite based ceramic from a potassium, cesium or rubidium exchanged zeolite. The zeolite has a $SiO_2/Al_2O_3$ ratio of 3.5 to about 7.5. Similarly U.S. Pat. Nos. 4,980,323 and 5,064,790 disclose a process and a cordierite ceramic prepared by the process. The cordierite can be prepared from a Mg exchanged zeolite such as zeolite B, philipsite, harmotone, gismondine, zeolite ZK-19 and zeolite W. Further, U.S. Pat. No. 5,036,030 discloses a process for preparing an alkaline earth metal aluminosilicate sintered body from a mixture of a zeolite in the alkaline earth metal form, having a $SiO_2/Al_2O_3$ ratio of not more than 3.0 and a boron compound such as boron oxide. Finally, U.S. Pat. No. 5,166,107 discloses preparing an anorthite sintered body from a calcium type zeolite having a $SiO_2/Al_2O_3$ ratio of less that 3.0.

In contrast to this art, applicant has prepared a dielectric ceramic article from a mixture of a crystalline aluminosilicate zeolite and a glass phase. The mixture can also contain a metal oxide additive such as $B_2O_3$ or $SrTiO_3$. The advantage to the use of zeolites in forming dielectric ceramic articles is that the higher reactivity of zeolite-derived powders vs. crystalline ceramic fillers such as alumina and cordierite allows more facile and complete solid state reaction during sintering and therefore easier formation of desired high-Q phases. Other advantages include increased uniformity in the resulting composition and associated increased uniformity in its electrical properties.

SUMMARY OF THE INVENTION

One embodiment of the present invention is a ceramic article precursor comprising from about 1% to about 99% by weight of a crystalline aluminosilicate zeolite or an amorphous aluminosilicate derived from the zeolite and from about 99% to about 1% by weight of a glass phase, the crystalline aluminosilicate zeolite having a composition on an anhydrous basis represented by an empirical formula of:

$$A_{1/n}Si_xAlO_y$$

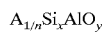

where A is an exchangeable cation selected from the group consisting of alkali metals, alkaline earth metals, transition metals, zinc, rare earth metals and mixtures thereof, "n" is the valence of A and has a value from about 1 to about 3, "x" has a value from about 1 to about 10 and "y" has a value which balances the sum of the valences of (A+Si+Al).

A process for preparing a dielectric ceramic article comprising forming a mixture of a crystalline aluminosilicate zeolite or an amorphous aluminosilicate derived from the zeolite and a glass phase into a shaped article and calcining the shaped article at a temperature of about 700° to about 1000° C. for a time of about 0.5 to about 24 hrs, the crystalline aluminosilicate zeolite having a composition on an anhydrous basis represented by an empirical formula of:

$$A_{1/n}Si_xAlO_y$$

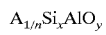

where A is an exchangeable cation selected from the group consisting of alkali metals, alkaline earth metals, transition metals, zinc, rare earth metals and mixtures thereof, "n" is the valence of A and varies from about 1 to about 3, "x" has value from about 1 to about 10 and "y" has a value which balances the sum of the valences of (A+Si+Al) and where the zeolite or amorphous aluminosilicate is present in an amount from about 1 wt. % to about 99 wt. % and the glass phase is present in an amount from about 99 wt. % to about 1 wt. %.

These and other objects and embodiments will become more apparent after a detailed description of the invention.

DETAILED DESCRIPTION OF THE INVENTION

As stated, the present invention relates to a ceramic article precursor and a process for preparing a dielectric ceramic article. One essential element of the invention is a crystalline aluminosilicate zeolite or an amorphous aluminosilicate derived from the zeolite. Zeolites are well known microporous three-dimensional framework structures. In general, the crystalline zeolites are formed from corner sharing $AlO_2$ and $SiO_2$ tetrahedra and are characterized as having pore openings of uniform dimensions, having a significant ion-exchange capacity and being capable of reversibly desorbing an adsorbed phase which is dispersed throughout the internal pores or voids of the crystal without displacing any atoms which make up the permanent crystal structure. Zeolites can be represented on an anhydrous basis, by the formula:

$$A_{1/n}Si_xAlO_y$$

where A is a cation having the valence of "n", "x" has a value of about 1 to about 10. In naturally occurring zeolites, A can be Li, Na, Ca, K, Mg and Ba. The A cations are loosely bound to the structure and frequently can be completely or partially replaced with other cations by conventional ion exchange techniques. Therefore, A is selected from the group consisting of alkali metals, alkaline earth metals, transition metals, rare earth metals, zinc and mixtures thereof and consequently "n" has a value from about 1 to about 3. Finally, "y" has a value which balances the sum of the valences of (A+Si+Al).

The zeolites which can be used in this invention include but are not limited to phillipsite, harmotone, gismondine, zeolite B, zeolite ZK-19, zeolite W, zeolite Y, zeolite L, zeolite LZ-210, zeolite omega, zeolite LZ-202 and mixtures thereof. For a detailed explanation of the structural similarities among the phillipsite group of zeolites, i.e. phillipsite, harmotome, zeolite B, zeolite ZK-19 and zeolite W and a list of references where specific structural information about these zeolites may be found, the reader is referred to U.S. Pat. No. 4,344,851 which is incorporated by reference. The important feature of this family of zeolites is the absence of framework sites which can be either irreversibly occupied by cations such as sodium or potassium or sites which, when occupied, effectively shield other sites from the exchanging cation. Zeolite LZ-210 is a zeolite Y whose silicon content has been increased by treatment with aqueous ammonium fluorosilicate $(NH_4)_2 SiF_6$. The preparation and characterization of zeolite LZ-210 is described in U.S. Pat. No. 4,503,023 which is incorporated in its entirety by reference. Zeolite LZ-202 is an omega-type zeolite prepared without a templating agent, whose preparation is disclosed in U.S. Pat. No. 4,840,779 which is incorporated by reference in its entirety. Of these zeolites, zeolite Y, L, B, W, and omega are preferred.

In the description which follows, zeolite B will be used to exemplify the process. However, this is not to be construed as limiting the invention in any way to zeolite B. Zeolite B is a synthetic zeolite having the formula:

$$Na_2O:Al_2O_3:xSiO_2$$

where "x" ranges from about 2 to about 5. The synthesis of zeolite B is described in U.S. Pat. No. 3,008,803 which is incorporated by reference and essentially entails forming a mixture of sodium aluminate ($NaAlO_2$), sodium silicate, sodium hydroxide and colloidal silica and heating this mixture at a temperature of about 60°–150° C., under autogenous pressure for a time of about 12 to about 96 hours. The resultant product is isolated, washed and dried. The amount of the reactants can be varied such that the $SiO_2/Al_2O_3$ ratio is from about 2 to about 5 and preferably from about 2.3 to about 2.8, particularly if cordierite is a desired component of the final glass-ceramic. Another method of preparing zeolite B or P is that found in European Patent Publication 315,282 which is incorporated herein by reference.

Since the presence of sodium ions in the resultant ceramic article is detrimental to the desired physical properties, it is necessary to maximize removal of the sodium cations in the zeolite. Two techniques are generally used to remove the sodium cation. One technique is a multiple ion exchange with e.g. magnesium or other desired cation while the other technique involves pre-exchanging the zeolite with a cation such as $NH_4^+$ followed by ion exchange with the desired ion.

Ion exchange is conveniently carried out by contacting the zeolite with an aqueous solution of the cation to be exchanged. Thus a dilute (about 1 molar) aqueous solution of magnesium nitrate ($Mg(NO_3)_2 \cdot 6H_2O$) is prepared and the pH of the solution is adjusted to about 7.5 with magnesium hydroxide ($Mg(OH)_2$). The volume of solution which is prepared is that amount which provides from about 5 to about 10 times the amount of magnesium ion needed to fully ion exchange the sodium or other alkali metals in the zeolite.

The contacting of the magnesium nitrate solution with the zeolite can conveniently be carried out in a batch process. Accordingly, the solution is mixed with the zeolite powder and the mixture is refluxed for about 2 hours. Next the mixture is filtered thereby isolating the zeolite powder. This procedure is repeated with a fresh batch of solution until the sodium level is less that 0.5 wt. % and preferably less than 0.2 wt. %. These sodium levels can be achieved after only six repetitions of the ion exchange procedure. Alternatively, the magnesium exchange can be carried out using a continuous process employing methods well known in the art such as placing the zeolite in a column and flowing the magnesium solution through the column or using a basket centrifuge. A continuous process has the advantage of allowing a more efficient utilization of the magnesium solution.

Another essential part of the invention is a silicate, borosilicate, or borate glass phase. The glass powders which can be used to prepare the glass phase can contain $SiO_2$ and/or $B_2O_3$ and one or more of $Al_2O_3$, MgO, CaO, $Li_2O$, PbO, ZnO, SrO, BaO, $K_2O$, $Cs_2O$, $TiO_2$, $ZrO_2$, $Nb_2O_5$, $Ta_2O_5$, $As_2O_5$, $Sb_2O_5$, $P_2O_5$, $GeO_2$, $SnO_2$, and $Bi_2O_3$. These glass powders are only by way of example and are not intended to limit the invention in any way. The glass phases are prepared by means well known in the art such as set forth in U.S. Pat. Nos. 4,714,687; 5,164,342; 6,232,251 all of which are incorporated by reference in their entirety. Basically the process involves obtaining a homogenous mixture of the desired components, placing the mixture in a platinum or refractory crucible and heating the crucible at temperatures of about 1200° C. to about 1650° C. for about 4 to 12 hours. The melt can then be poured into molds to obtain a slab, into water to obtain fine particles, through a set of rollers to obtain flakes, etc.

Regardless of how the glass phase is obtained it is mixed with a powder of the desired zeolite by means well known in the art such as ball milling. The amounts of zeolite or amorphous aluminosilicate and the amount of glass phase in the mixture and consequently in the ceramic article precursor can vary considerably, but usually the amount of zeolite or amorphous aluminosilicate varies from about 1 wt. % to about 99 wt. % and preferably from about 5 wt. % to about 95 wt. %. The amount of glass phase varies from about 99 to about 1 wt. % and preferably from about 95 to about 5 wt. %. The resultant mixture is generally formed into a shaped article such as a sheet or tape by first preparing a slurry of the mixture using means well known in the art, e.g. dispersing the powder in a solvent and then ball milling. The solvent for the slurry can be aqueous or organic with organic preferred. Organic solvents include, without limitation, toluene, methyl ethyl ketone, ethanol, methanol, xylenes, acetone and mixtures thereof.

The slurry can also optionally contain one or more of a forming aid selected from a binder, plasticizer and surfactant. Non-limiting examples of binders include polyvinyl alcohol, polyvinyl butyral, polyvinyl chloride, cellulose acetate, nitrocellulose, methyl cellulose, ethyl cellulose, hydroxyethyl cellulose, hydroxpropyl methyl cellulose, polyacrylate esters, polymethyl methacrylate, polyethyl methacrylate, polyethylene, polyalkylene glycol, petroleum resins, ethylene oxide polymer, polypropylene carbonate, polytetrafluoroethylene, poly-alpha-methyl styrene, etc. Examples of plasticizers include but are not limited to n-butyl phthalate, dioctyl phthalate, butyl benzyl phthalate, polyethylene glycol, polypropylene glycol, glycerine, ethyltoluene sulfonamides, tri-n-butyl phosphate, butyl sterate, etc. Examples of surfactants, sometimes referred to as dispersants/deflocculants, include but are not limited to polyisobutylene, linoleic acid, oleic acid, citric acid, stearic acid, lanolin fatty acids, corn oil, safflower oil, glycerol trioleate, dibutyl amine, substituted imidazolines, sulfonates, phosphate esters, etc.

If present, the total amount of forming aid present in the mixtures and the resultant ceramic article precursor varies from about 2 to about 10 wt. %, preferably from about 3 to about 9 wt. % and most preferably from about 4 to about 9 wt. %. If more than one forming aid is present, e.g. a binder and a plasticizer, then the amount of forming aid present is the sum of the amount of binder plus the amount of plasticizer.

The resultant mixture can be formed into various shaped articles (depending on its viscosity). However, for use in dielectric applications, it is usually cast into a tape or a sheet. This is done by applying the slurry to a polyester film using a doctor blade or other means known in the art. The thickness of the tape can vary considerably but is usually from about 50 to about 500 $\mu$m. Although the ceramic precursor containing film can be fired at this point, a number of sheets are usually first stacked together. Usually a patterned electrically conductive layer is applied to each sheet or ply along with hole connectors, termed vias, in the ply for connecting the patterned electrically conductive layers of the respective plies to form a predetermined wiring circuit. Next the laminate (or any other shaped article) is sintered together at a temperature of about 700° C. to about 1000° C. for a time sufficient to form a ceramic article. This is usually from about 0.5 hours to about 24 hours. Depending on the type of conductive ink which is used, the sintering can be done in air or under a non-oxidizing atmosphere. Thus, for silver or gold sintering can be carried out in air, while copper requires a non-oxdizing atmosphere.

Although the zeolite can be used in its crystalline state, it is preferred to treat the zeolite prior to mixing it with the glass phase. The zeolite is calcined at a temperature sufficient to collapse the zeolite framework structure but not sufficient to begin sintering. For example, for magnesium zeolite B, this temperature is between about 600° C. to about 825° C. and preferably about 650° C. to about 815° C. The range for the "collapse" temperature for any zeolite can be easily determined by simple experimentation or data available in the literature. This preliminary calcination provides an amorphous aluminosilicate which can be sintered over a wider temperature range and which has less shrinkage when sintered.

The mixture of zeolite/amorphous aluminosilicate and glass phase may also contain a metal oxide additive. The metal oxide additives include but are not limited to $B_2O_3$, $P_2O_5$, $TiO_2$, $CaTiO_3$, $Al_2O_3$, $SrTiO_3$, $SiO_2$, $BaTiO_3$, $ZrO_2$, $CeO_2$, $SnO_2$, $Nb_2O_5$, $Ta_2O_5$, $MoO_3$, $WO_3$, $V_2O_5$, $Sb_2O_5$ and mixtures thereof. Instead of one or more of the oxide additives named above a metal oxide precursor can be added. The type of metal oxide precursor which can be added is a metal compound which upon heating will give the metal oxide. The compounds can be, but are not limited to, the nitrates, carbonates, citrates, acetates, hydrous oxides, hydroxides, etc. including mixtures thereof. The metal can be one or more of titanium, zirconium, calcium, strontium, barium, magnesium, zinc, cerium, vanadium, niobium, molybdenum, antimony, tin, etc.

The amount of metal oxide additive can be present in an amount over a wide range, but usually from about 1 to about 20 wt. %, preferably from about 2 to about 15 wt. % and most preferably from about 3 to about 10 wt. % as the metal oxide. If a metal oxide precursor is used, the amount used is that which would produce from about 1 to about 20 wt. %, preferably from about 2 to about 15 wt. % and most preferably from about 3 to about 10 wt. % as the metal oxide. These metal oxide additives act as nucleating agents, sintering aids and as modifiers to the electrical properties of the resulting ceramic.

In order to fully illustrate the instant invention, the following examples are set forth. It is to be understood that the examples are only by way of illustration and are not intended as an undue limitation on the broad scope of the invention as set forth in the appended claims.

EXAMPLES

Several glasses were used in preparing dielectric ceramic precursors and dielectric ceramics. The compositions of the glass phases are presented in Table 1.

TABLE 1

| | Glass Phase Composition (wt %) | | | | | | | | |
|---|---|---|---|---|---|---|---|---|---|
| Id # | $SiO_2$ | $B_2O_3$ | BaO | SrO | CaO | MgO | ZnO | $K_2O$ | $Al_2O_3$ |
| 1 | 47.7 | 13.9 | 7.3 | 9.2 | 14.4 | | 7.0 | | 0.2 |
| 2 | 27.1 | 20.8 | 49.8 | | | | | | |
| 3 | 26.2 | 20.0 | 46.7 | | | | 4.6 | | 0.2 |
| 4 | 51.5 | 13.7 | 7.1 | 9.8 | | 11.1 | | 3.7 | 0.2 |

Mg zeolite B was prepared as described in U.S. Pat. No. 5,064,790 which is incorporated in its entirety by reference. The Mg zeolite B was then calcined at 750° C. for 2 hours to provide an amorphous oxide.

The binder used for all the experiments was a mixture of polyvinyl alcohol (PVA) and polyalkylene glycol (PEG) and water. The composition of the binder is as follows: 11.9 wt. % PVA; 8.0 wt. % PEG, and 80.1 wt. % $H_2O$. The binder was prepared as follows. One half of the required water was added to a flask equipped with a reflux condenser and the water heated to reflux, at which point the PVA was added while stirring. Once a clear solution was obtained (about 10 min.), the desired amount of PEG was added dropwise, followed by the addition of the rest of the water. Finally, the mixture was heated at 95° C. for 2 hours with stirring and then cooled to room temperature.

Ceramic precursor pellets were prepared by mixing a calcined MgB oxide, a glass and a binder and then forming a circular (1" diameter by ~0.125" thick) pellet by pressing at 4000 lbs/in$^2$. Next the pellets were sintered by heating to 200° C. at 5° C./min, then at 10° C./min to 700° C. and finally at 4° C./min to either 850° C. or 900° C. The resultant sintered pellets were analyzed by x-ray diffraction (XRD) to determine the crystalline phases.

A summary of the various mixtures which were formed and the results of the analyses on the final ceramic article are presented in Table 2. The Material column indicates the proportion (in wt %) of amorphous calcined magnesium B zeolite to the glass indicated. The next column is the sintering temperature, followed by a column with the phases present in the sintered ceramic. Sintering times were 4 hr at 900° C. and 6 hr at 850° C. Dielectric measurements were carried out on lapped and polished samples which had been coated with silver paint on both faces or with vacuum deposited gold coatings on both faces. The next three columns contain the measured dielectric constant (k) at the indicated frequencies and the last three columns are the measured dielectric loss (tan δ) at the indicated frequencies.

TABLE 2

Ceramic Precursor Powder Compositions, Sintering Temperatures and Dielectric Properties

| Material | Sinter Temp: ° C. | Phases | k | | | Tan δ | | |
|---|---|---|---|---|---|---|---|---|
| | | | 1 MHz | 100 KHz | 10 KHz | 1 MHz | 100 KHz | 10 KHz |
| 70:30 calcined MgB:glass 4 | 900 | Cordierite, anorthite | 5.41 | 5.52 | 5.57 | 0.011 | 0.011 | 0.013 |
| 50:50 calcined MgB:glass 2 | 900 | Celsian | 4.97 | 5.03 | 5.02 | 0.0046 | 0.0043 | 0.0059 |
| 70:30 calcined MgB:glass 2 | 900 | Celsian | 5.88 | 5.96 | 5.92 | 0.0077 | 0.0056 | 0.0078 |
| 70:30 calcined MgB:glass 3 | 850 | Celsian | 5.00 | 5.06 | 5.05 | 0.0061 | 0.0055 | 0.0087 |
| 70:30 calcined MgB:glass 1 | 900 | Cordierite, anorthite | 5.40 | 5.47 | 5.45 | 0.0072 | 0.0054 | 0.0067 |
| 50:50 calcined MgB:glass 1 | 850 | Cordierite, anorthite | 5.31 | 5.37 | 5.35 | 0.0058 | 0.0051 | 0.0061 |
| 95:5 calcined MgB:glass 2 | 900 | Cordierite Celsian | 6.12 | 6.21 | 6.20 | 0.008 | 0.007 | 0.011 |
| 98:2 calcined MgB:glass 2 | 900 | Cordierite Celsian | 6.19 | 6.31 | 6.37 | 0.011 | 0.012 | 0.022 |

What is claimed is:

1. A dielectric ceramic article precursor comprising from about 1 wt. % to about 99 wt. % of a crystalline aluminosilicate zeolite or an amorphous aluminosilicate derived from the zeolite and from about 99 wt. % to about 1 wt. % of a glass phase, the zeolite having a composition on an anhydrous basis represented by an empirical formula of:

$$A_{1/n}Si_xAlO_y$$

where A is an exchangeable cation selected from the group consisting of alkali metals, alkaline earth metals, transition metals, zinc, rare earth metals and mixtures thereof, "n" is the valance of A and varies from about 1 to about 3, "x" has a value from about 1 to about 10 and "y" has a value which balances the sum of the valences of (A+Si+Al).

2. The ceramic article precursor of claim 1 where the crystalline aluminosilicate zeolite or amorphous aluminosilicate is present in an amount from about 5 wt. % to about 95 wt. %.

3. The ceramic article precursor of claim 1 characterized in that it is in the shape of a tape.

4. The ceramic article precursor of claim 1 where A is selected from the group consisting of magnesium, calcium, strontium, zinc, barium and mixtures thereof.

5. The ceramic article precursor of claim 1 further comprising a metal oxide additive selected from the group consisting of $B_2O_3$, $P_2O_5$, $TiO_2$, $CaTiO_3$, $Al_2O_3$, $SrTiO_3$, $SiO_2$, $BaTiO_3$, $ZrO_2$, $CeO_2$, $SnO_2$, $Nb_2O_5$, $Ta_2O_5$, $MoO_3$, $WO_3$, $V_2O_5$, $Sb_2O_5$ and mixtures thereof.

6. The ceramic article precursor of claim 1 further comprising a metal oxide precursor additive selected from the group consisting of nitrates, carbonate, citrates, acetates, hydrous oxides, hydroxides and mixtures thereof of a metal selected from the group consisting of titanium, zirconium, calcium, strontium, barium, magnesium, zinc, cerium, vanadium, niobium, molybdenum, antimony, tantalum, tin and mixtures thereof.

7. The ceramic article precursor of claim 1 where the zeolite is selected from the group consisting of phillipsite, harmotone, gismondine, zeolite B, zeolite ZK-19, zeolite W, zeolite Y, zeolite L, zeolite LZ-210, zeolite omega, zeolite LZ-202 and mixtures thereof.

8. The ceramic article precursor of claim 7 where the zeolite is zeolite B.

9. The ceramic article precursor of claim 1 further characterized in that it comprises a forming aid selected from the group consisting of binders, plasticizers, surfactants and mixtures thereof.

10. The ceramic article precursor of claim 9 where the binder is selected from the group consisting of polyvinyl alcohol, polyvinyl butyral, polyvinyl chloride, cellulose acetate, nitrocellulose, methyl cellulose, ethyl cellulose, hydroxyethyl cellulose, hydroxpropyl methyl cellulose, polyacrylate esters, polymethyl methacrylate, polyethyl methacrylate, polyethylene, polyalkylene glycol, petroleum resins, ethylene oxide polymer, polypropylene carbonate, polytetrafluoroethylene, poly-alpha-methyl styrene, and mixtures thereof.

11. The ceramic article precursor of claim 9 where the plasticizer is selected from the group consisting of n-butyl phthalate, dioctyl phthalate, butyl benzyl phthalate, polyethylene glycol, polypropylene glycol, glycerine, ethyltoluene sulfonamides, tri-n-butyl phosphate, butyl sterate and mixtures thereof.

12. The ceramic article precursor of claim 9 where the surfactant is selected from the group consisting of polyisobutylene, linoleic acid, oleic acid, citric acid, stearic acid, lanolin fatty acids, corn oil, safflower oil, glycerol trioleate, dibutyl amine, substituted imidazolines, sulfonates, phosphate esters, and mixtures thereof.

13. The ceramic article precursor of claim 9 where the forming aid is present in an amount from about 2 to about 10 wt. %.

14. The ceramic article precursor of claim 5 where the metal oxide additive is present in an amount from about 1 to about 20 wt. %.

15. The ceramic article precursor of claim 6 where the metal oxide precursor is present in an amount to produce from about 1 to about 20 wt. % of the metal oxide.

16. A process for preparing a dielectric ceramic article comprising forming a mixture of a crystalline aluminosilicate zeolite or an amorphous aluminosilicate derived from the zeolite and a glass phase into a shaped article and calcining the shaped article at a temperature of about 700° to about 1000° C. for a time of about 0.5 to about 24 hrs, the crystalline aluminosilicate zeolite having a composition on an anhydrous basis represented by an empirical formula of:

$$A_{1/n}Si_xAlO_y$$

where A is an exchangeable cation selected from the group consisting of alkali metals, alkaline earth metals, transition metals, zinc, rare earth metals and mixtures thereof, "n" is the valence of A and varies from about 1 to about 3, "x" has a value from about 1 to about 10 and "y" has a value which balances the sum of the valences of (A+Si+Al) and where the zeolite or amorphous aluminosilicate is present in an amount from about 1 wt. % to about 99 wt. % and the glass phase is present in an amount from about 99 wt. % to about 1 wt. %.

17. The process of claim 16 where the mixture is cast into a tape.

18. The process of claim 16 where the zeolite is selected from the group consisting of phillipsite, harmotone, gismondine, zeolite B, zeolite ZK-19, zeolite W, zeolite Y, zeolite L, zeolite LZ-210, zeolite omega, zeolite LZ-202 and mixtures thereof.

19. The process of claim 18 where the zeolite is zeolite B.

20. The process of claim 16 further characterized in that the mixture comprises a forming aid selected from the group consisting of binders, plasticizers, surfactants and mixtures thereof.

21. The process of claim 20 where the binder is selected from the group consisting of polyvinyl alcohol, polyvinyl butyral, polyvinyl chloride, cellulose acetate, nitrocellulose, methyl cellulose, ethyl cellulose, hydroxyethyl cellulose, hydroxpropyl methyl cellulose, polyacrylate esters, polymethyl methacrylate, polyethyl methacrylate, polyethylene, polyalkylene glycol, petroleum resins, ethylene oxide polymer, polypropylene carbonate, polytetrafluoroethylene, poly-alpha-methyl styrene and mixtures thereof.

22. The process of claim 20 where the plasticizer is selected from the group consisting of n-butyl phthalate, dioctyl phthalate, butyl benzyl phthalate, polyethylene glycol, polypropylene glycol, glycerine, ethyltoluene sulfonamides, tri-n-butyl phosphate, butyl sterate and mixtures thereof.

23. The process of claim 20 where the surfactant is selected from the group consisting of polyisobutylene, linoleic acid, oleic acid, citric acid, stearic acid, lanolin fatty acids, corn oil, safflower oil, glycerol trioleate, dibutyl amine, substituted imidazolines, sulfonates, phosphate esters and mixtures thereof.

24. The process of claim 20 where the forming aid is present in an amount from about 1 to about 10 wt. %.

25. The process of claim 16 further characterized in that the mixture comprises a metal oxide additive selected from the group consisting of $B_2O_3$, $P_2O_5$, $TiO_2$, $CaTiO_3$, $Al_2O_3$, $SrTiO_3$, $SiO_2$, $BaTiO_3$, $ZrO_2$, $CeO_2$, $SnO_2$, $Nb_2O_5$, $Ta_2O_5$, $MoO_3$, $WO_3$, $V_2O_5$, $Sb_2O_5$ and mixtures thereof.

26. The process of claim 16 further characterized in that the mixture comprises a metal oxide precursor additive selected from the group consisting of nitrates, carbonate, citrates, acetates, hydrous oxides, hydroxides and mixtures thereof of a metal selected from the group consisting of titanium, zirconium, calcium, strontium, barium, magnesium, zinc, cerium, vanadium, niobium, molybdenum, antimony, tantalum, tin and mixtures thereof.

27. The process of claim 25 where the metal oxide additive is present in an amount from about 1 to about 20 wt. %.

28. The process of claim 26 where the metal oxide precursor is present in an amount to produce from about 1 to about 20 wt. % of the metal oxide in the dielectric ceramic article.

29. The product of the process of claim 16.

30. The process of claim 16 further characterized in that the mixture is dispersed in a solvent to form a slurry prior to forming a shaped article.

31. The process of claim 30 where the solvent is selected from the group consisting of toluene, methyl ethyl ketone, ethanol, methanol, xylenes, acetone and mixtures thereof.

* * * * *